United States Patent

Hanawa et al.

[11] Patent Number: 5,885,369
[45] Date of Patent: Mar. 23, 1999

[54] SOLDER POWDER, METHOD FOR MAKING THE SOLDER POWDER AND SOLDER PASTE USING THE SOLDER POWDER

[75] Inventors: Kenzo Hanawa, Ageo; Takayuki Araki, Shimonoseki; Yoshinobu Okamura, Kanagawa; Yasuhiro Asano, Yokohama, all of Japan

[73] Assignee: Mitsui Mining & Smelting Co., Ltd., Tokyo, Japan

[21] Appl. No.: 911,674

[22] Filed: Aug. 15, 1997

[30] Foreign Application Priority Data

Aug. 15, 1996 [JP] Japan .................................... 8-233633

[51] Int. Cl.⁶ ..................................................... B23K 35/40
[52] U.S. Cl. .............................................. 148/24; 428/403
[58] Field of Search .................................. 148/22, 23, 24, 148/25, 240; 228/223; 428/403

[56] References Cited

U.S. PATENT DOCUMENTS

| 4,298,407 | 11/1981 | Taylor | 148/24 |
| 5,328,522 | 7/1994 | Sowa et al. | 148/23 |
| 5,674,326 | 10/1997 | Wrezel et al. | 148/24 |

FOREIGN PATENT DOCUMENTS 63-248567 10/1988 Japan .
06063788 3/1994 Japan .

*Primary Examiner*—Sikyin Ip
*Attorney, Agent, or Firm*—Flynn, Thiel, Boutell & Tanis, P.C.

[57] ABSTRACT

According to the present invention, the oxidation of the surface of solder particles is inhibited and the generation of solder balls in the reflow soldering process is inhibited. More specifically, the present invention protects the surface of the solder particles from oxidation during all steps, including the storage of a solder powder, formation of a paste from the solder powder, printing, transferring to a reflow oven and reflow soldering, to minimize the oxidation of the solder particles at these steps so that the generation of solder balls is minimized. In addition, the present invention provides a method for making the solder powder and a solder paste using the solder powder. The objective of the present invention is achieved by the solder powder, the particles of which have on the surface thereof an organometallic compound composed of adipic acid and a metal of the solder alloy. This solder powder is produced by reacting particles of the solder alloy powder with vaporized adipic acid. According to the present invention, the solder powder, the particles of which have on the surface thereof an adipic acid-derived organometallic compound combined chemically with the surface of the solder particles, is blended with a flux to be made into a paste.

11 Claims, 4 Drawing Sheets

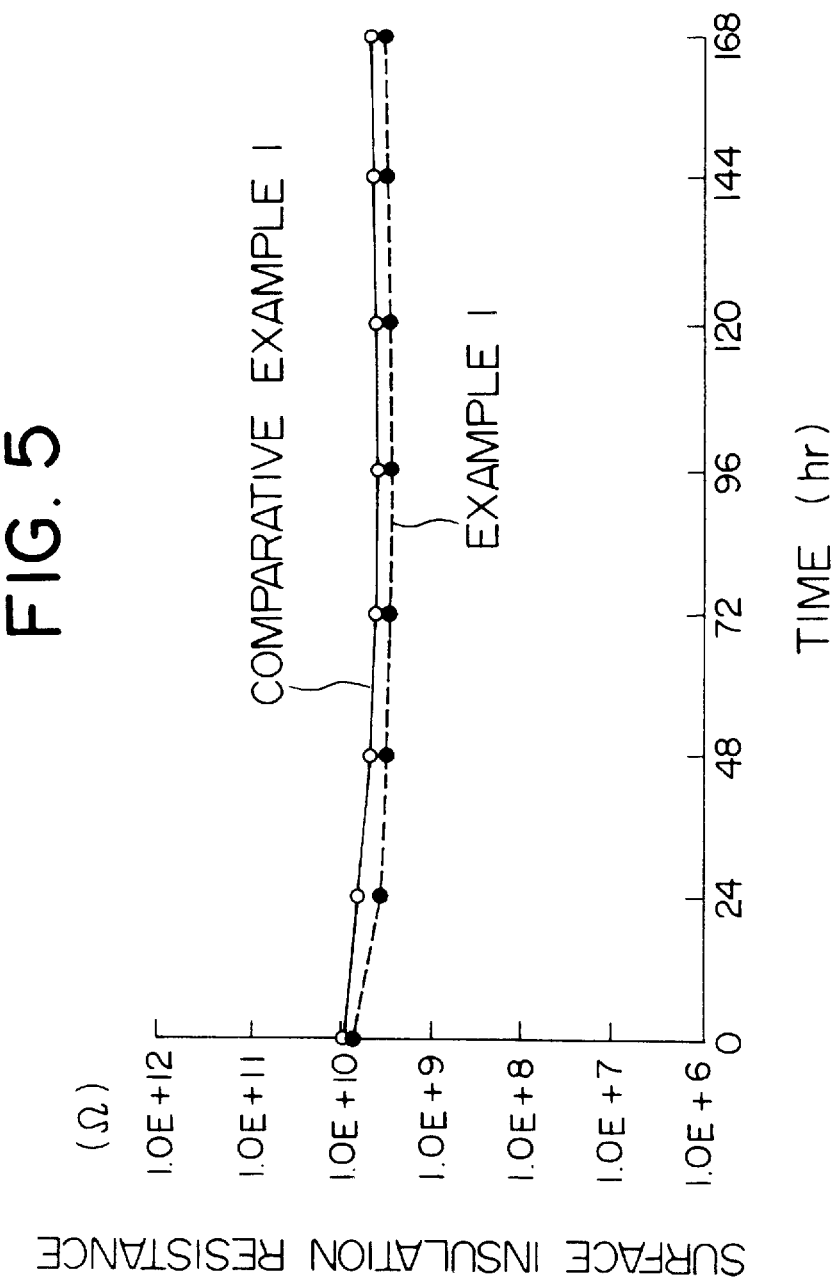

SOLDER POWDER, METHOD FOR MAKING THE SOLDER POWDER AND SOLDER PASTE USING THE SOLDER POWDER

BACKGROUND OF THE INVENTION

1. Field of the Invention

The present invention relates to a solder powder which comprises solder particles having a protective layer formed thereon composed of a metal salt of adipic acid, a method for making the solder powder and a solder paste using the solder powder.

2. Description of the Prior Art

With the recent wide-spread use of compact, light-weight apparatuses, such as a portable telephone, the electronic circuits which are to be incorporated in these apparatus are being miniaturized and more densely packed, highlighting the increasing importance of the technology of mounting a variety of parts on a circuit substrate. Particularly, the technical level of micro-soldering, which is the most important mounting technology, is becoming increasingly higher. As a result, a strict technical requirement is placed on the solder paste. For example, the particle size of the solder powder is becoming smaller and yet the generation of solder balls must be minimized because of the adoption of a manufacturing process which abolishes a cleaning treatment of a soldered product due to the phasing-out of flons, i.e., chlorofluorocarbons. The solder balls are generated in the soldering operation mainly due to the presence of an oxide film on the surface of the particles of the solder powder. Since this oxide film does not break off even if the interior of the solder particles are fused when the temperature reaches the melting point of the solder, the solder particles cannot combine with other fused solder portion and thus small balls are formed. This phenomenon becomes particularly conspicuous when a fine solder powder is used in order to enhance the printability. Based on the above-described background, many attempts have been made to inhibit the surface oxidation to thereby inhibit the generation of the solder balls. Examples of these attempts include a technique wherein a solder powder is produced in an atmosphere of an inert gas, a technique wherein the solder particle is made as spherical as possible to decrease the surface area and a technique wherein fine solder particles which are more susceptible to the oxidation are eliminated. These techniques, however, have drawbacks, for example, that the inhibition of the solder ball generation by these techniques is limited and that the surface of the solder particles is damaged when the fine particles are eliminated by means of sieving. Moreover, the elimination of fine solder particles by sieving is disadvantageous from the viewpoint of the current trend of using fine particles for finer pattern printing. Anyway, an attempt to decrease the oxidation of the surface of the solder particle itself by the above-mentioned techniques is not successful because it is impossible to provide an oxygen-free atmosphere for all steps, such as storing or handling of the solder powder, making a paste from the solder powder, printing, transferring to a reflow oven and reflow soldering, even if the solder powder is produced in a strictly controlled, oxygen-free atmosphere. Consequently, the oxidation of the solder powder at the above-mentioned steps cannot be perfectly prevented. Yet another method for minimizing the generation of solder balls by preventing the oxidation of the solder powder at the above-mentioned steps includes the incorporation of an active ingredient in a slightly excessive amount for the removal of the oxide in the flux at the time of impasting the solder powder. The resulting residual flux after soldering is removed by cleaning with a flon. However, according to the scheduled phase-out of flons in view of environmental protection, a manufacturing process which dispenses with the cleaning step by reducing the incorporated amount of the active ingredient is intensively studied in order to increase the reliability of the products.

For example, U.S. Pat. No. 4,298,407 proposes a tin-based alloy solder powder composition which comprises particles of a tin-based alloy solder coated with a flux composed of an organic acid. The types of the coating flux according to this U.S. patent include a dicarboxylic acid, more particularly, succinic acid and salicylic acid. According to the U.S. patent, since the organic acid coated onto the alloy particles dissolves the tin oxide formed on the surface of the solder particles and thus cleans the surface of the tin-containing solder particles, the generation of the solder balls is inhibited. Such an organic acid is blended with the solder powder by means of a beads mill for a short period of time so that the particles of the solder powder are coated with the organic acid.

One problem of the invention of the above-mentioned U.S. patent is that, since the organic acid layer is formed by mere mechanical blending by means of the beads mill, the organic acid merely adheres to the surface of the solder alloy particles, so that the adhesive strength of the organic acid to the particles of the solder powder is weak and the organic acid partly peels off the particles at the time of handling or impasting the solder powder and, therefore, the oxidation prevention of the solder powder is insufficient. Another problem is that, when a paste is produced from this solder powder, the organic solvent contained in the paste dissolves away the organic acid to remove the organic acid layer from the particles of the solder powder and that the oxidation of the solder powder is accelerated at a reflow step because of the presence of the damage which has been caused by the treatment with beads on the surface of the particles of the solder powder. In addition, it is an art-recognized fact that the above-mentioned organic acids are not so effective with lead oxide in the case of a lead-containing solder alloy, which is commonly used as a solder alloy, although these organic acids are effective in dissolving the tin oxide to clean the solder particle surface. Therefore, the use of a flux which contains a substance such as isopropylamine or triethanolamine, is considered indispensable for inhibiting the generation of solder balls in the case of a lead-containing solder alloy.

SUMMARY OF THE INVENTION

The present invention is made to inhibit the generation of solder balls in not only a lead-free solder alloy but also in a generally-used, lead-containing solder alloy. For this purpose, an object of the present invention is to provide a solder powder which enables the solution of the items mentioned below together with a method for making the solder powder and a solder paste using the solder powder.

(1) To inhibit the oxidation of solder powder from the time after the production of the solder powder until the time of impasting the solder powder;

(2) To omit the traditional practice of eliminating fine particles, which tend to be oxidized and which have a particle diameter of less than 20 $\mu$m, by sieving, classification or the like; and (3) To protect, as much as possible, the surface of the solder particles from oxidation during all steps, including formation of a paste from a solder powder, printing, transferring to a reflow oven and reflow soldering, so that the generation of solder balls is minimized.

Another object of the present invention is to provide a solder paste using the above-described solder powder.

Yet another object of the present invention is to provide a method for making the above-described solder powder.

These objectives of the present invention are achieved by the use of a solder powder comprising solder alloy particles which have on the surface thereof an organometallic compound composed of adipic acid and a metal of the solder alloy, and a solder paste using this solder powder or the solder paste using the solder powder containing the solder particles having a particle diameter of less than 20 μm. This solder powder is produced by a reaction between the solder alloy powder and the vaporized adipic acid.

BRIEF DESCRIPTION OF THE DRAWINGS

FIG. 5 shows the changes with time in the surface insulation resistance of the pattern on the boards printed using the pastes.

DESCRIPTION OF THE PREFERRED EMBODIMENTS

Figure 1:
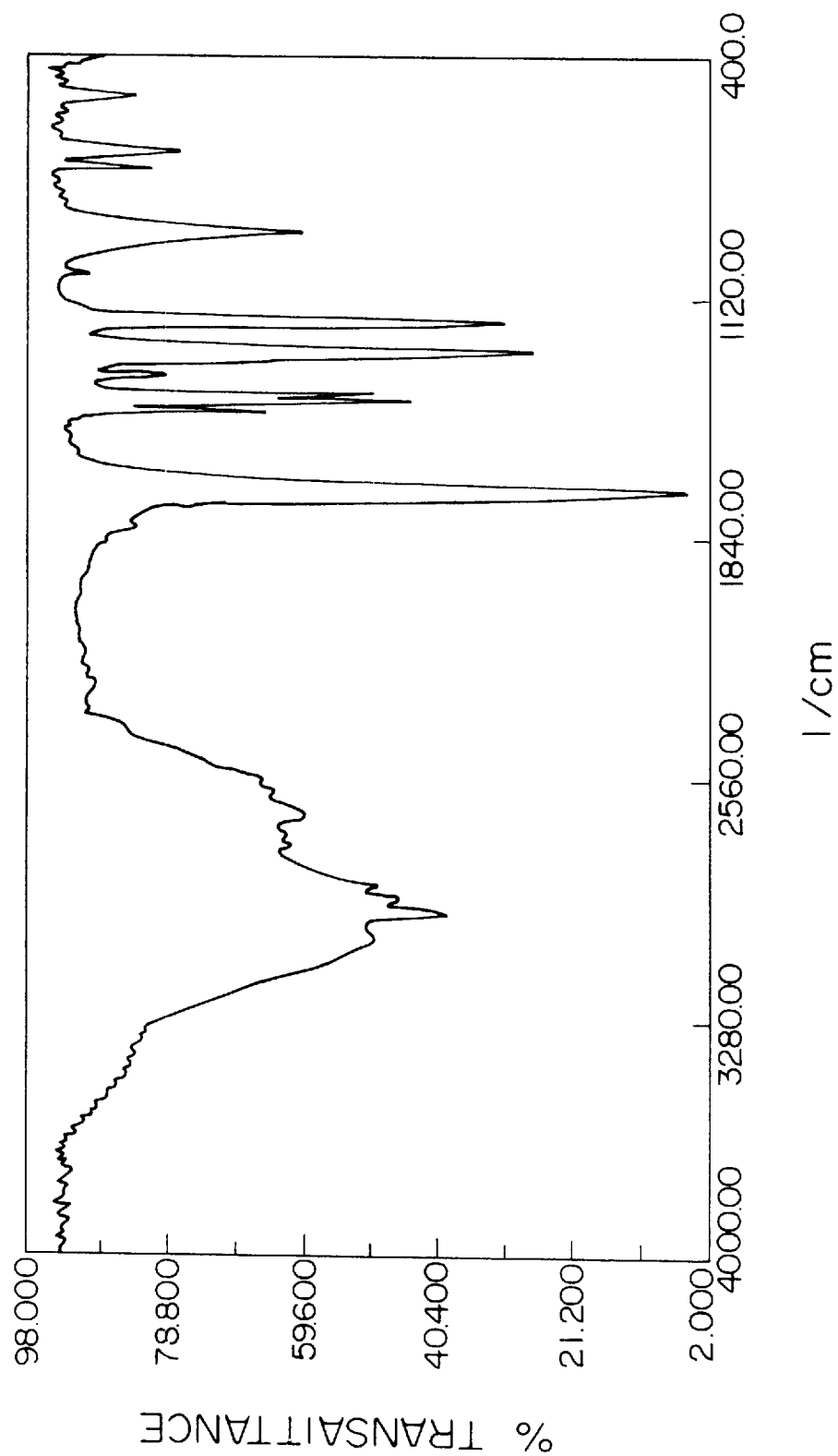
FIG. 1 shows the IR (infrared) absorption spectrum of adipic acid by use of FT-IR (Fourier transform infrared spectroscopy).

It is well known that the progress of oxidation of a metal can be inhibited by coating the surface of the metal with an organic substance which acts as a barrier to oxygen and moisture. However, as is apparent from the previous description, since the soldering paste is prepared by blending a solder powder with an organic solvent, the organic substance which merely adheres to the surface of the particles of the solder powder is dissolved away into the organic solvent and cannot function to prevent the oxidation of the particle surface. Therefore, the organic substance is required to combine chemically with the alloying components of the solder alloy and the resultant organometallic compound is required to be present on the entire surface of the solder particle. The present inventors found that an organic acid, adipic acid in particular, combines chemically with a metal of the solder alloy to form a tough which is insoluble in the organic solvent and thus completed the present invention.

The effectiveness of adipic acid as a substance which forms an organometallic compound on the surface of solder particles became known from the findings in the course of the developmental studies described below. Generally, a carboxylic group easily reacts with a metal to form a compound. Particularly, a reaction between a vaporized organic substance having a carboxyl group and a solder alloy powder produces a compound which has a high adhesive strength to the surface of the solder alloy at the site of the carboxyl moiety at a high efficiency and which can prevent the oxidation of the solder powder, even after impasting the powder. An organic acid having two carboxyl groups per molecule can produce an organometallic compound which adheres to the surface more firmly than an organic acid having one carboxyl group. In this case, the two carboxyl groups preferably have the same function. In order to provide the two carboxyl groups having the same function, the organic acid preferably has a straight chain structure. However, if the chain is too long, a strong bond to the solder alloy particles cannot be obtained because the number of reacting site is reduced, whereas if the chain is too short, the hydrophilic property is enhanced and the resulting compound tends to absorb moisture so that the stability of the paste is impaired. According to the studies of the present inventors, examples of the organic acid which has the above-described effect and two carboxyl groups per molecule include succinic acid and glutaric acid, and particularly, adipic acid having 6 carbon atoms which has carboxyl groups at both ends of the chain exhibits a particularly strong bond to the metal of the solder alloy. An additional advantage of using adipic acid is that since adipic acid has a boiling point of 206° C., which is lower than the soldering temperature, the adipic acid sublimates at the reflow soldering step and does not remain in the residual flux. Moreover, the adipic acid is also practical because of its inexpensive cost.

In the present invention, a variety of solder alloys can be used as a solder powder. Although a typical example of the solder alloy is a tin-lead alloy, particularly a eutectic solder alloy thereof, the alloy may contain other elements such as indium, silver, bismuth, zinc, antimony and copper. In addition, a solder powder containing fine particles having a particle diameter of less than 20 μm which has been heretofore difficult to use can be used as a material for the paste according to the present invention. Needless to say, in order to meet the recent requirement for a fine circuit pattern having a pitch as small as 150 μm, a solder powder which contains fine particles having a particle diameter of less than 20 μm is advantageous in forming by screen printing such a fine circuit pattern on a substrate. Although the fine particles having a particle diameter of less than 20 μm are easily oxidized and were conventionally removed by sieving, there is no such limitation in the present invention and solder powder having a particle diameter of 75 μm or less (but excluding 0) can be used. More preferably, the particles of the solder powder have a particle diameter of less than 45 μm so as not to impede the blending operation in the production of a paste and the fine pattern printing by the use of the paste. In addition, when the organometallic compound which is present on the surface of the solder alloy particles is extracted with an acid for the purpose of quantitatively determining the amount, the amount thus obtained of the organometallic compound, calculated as adipic acid, ranges from 0.01 to 0.5% by weight based on the total amount of the solder powder. The preferable range is from 0.01 to 0.3% by weight and more preferably, from 0.04to 0.2% by weight. If the amount is less than 0.01% by weight, the adipic acid cannot produce a coating film effective to prevent the oxidation during the handling of the solder powder, and the inhibition of the generation of the solder balls deteriorates, whereas if the amount exceeds 0.5% by weight, the excessive treating agent causes the solder particles to agglomerate during the handling of the solder powder and the resultant poor dispersion makes the impasting of the solder powder difficult; and moreover, the increase in cost due to the increase of the amount is not commensurate with the effect.

A preferred method for producing a solder powder having the adipic acid bonded chemically to the surface of the solder particles is the reaction of the vaporized adipic acid with the surface of the solder particles. Examples of the mode of reaction include the spraying of the vaporized adipic acid onto the solder powder and the blending of the solder powder with the adipic acid and thereafter heating the blend. The reaction temperature needs to be higher than room temperature so that the adipic acid reacts with the surface of the solder particles to form the compound on the surface thereof. However, the temperature of the solder powder needs to be below 150° C. at the time when the vapor of the adipic acid is brought into a direct reaction with the solder powder, because the solder powder starts sintering at a temperature above 150° C.

Figure 2:
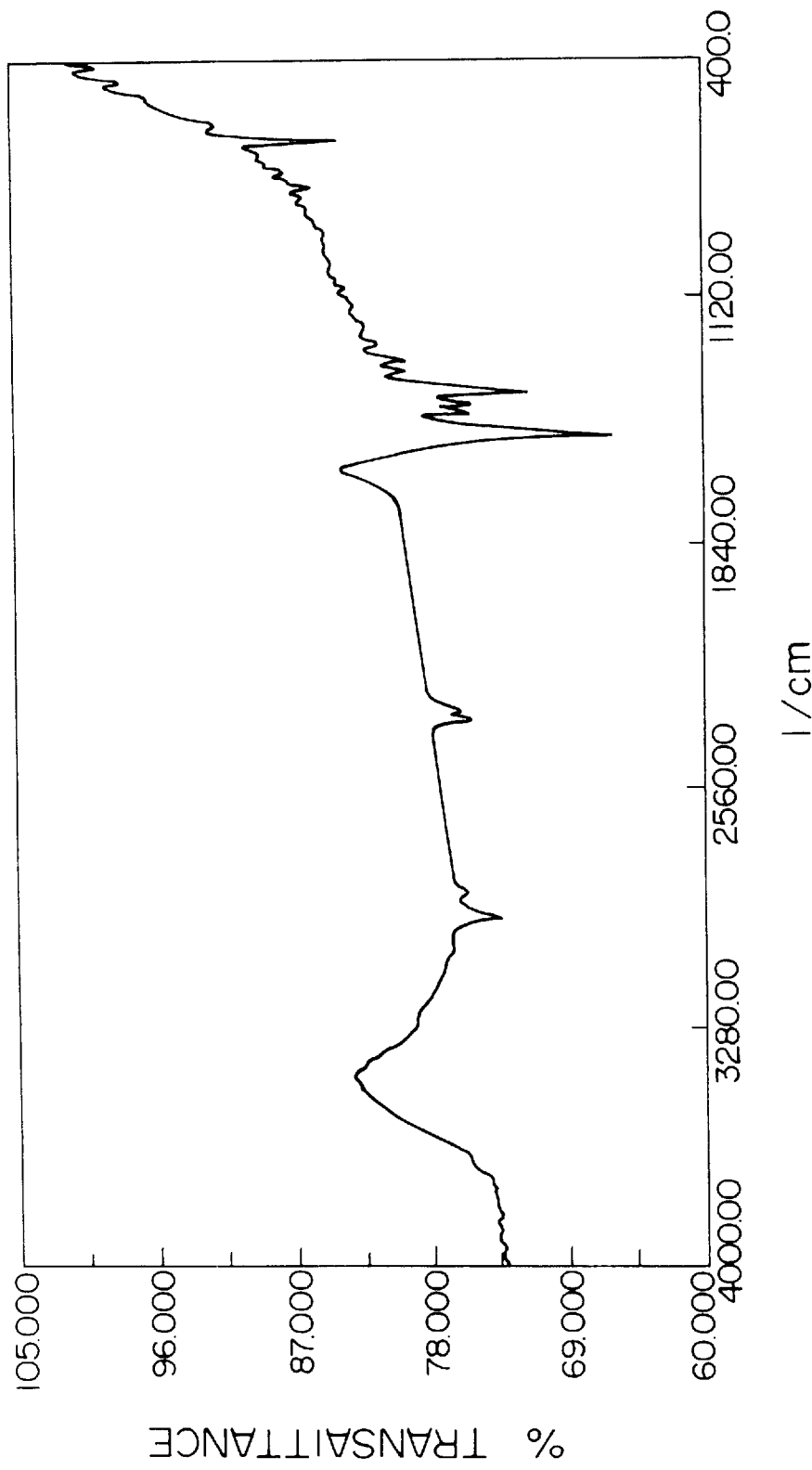
FIG. 2 shows the IR absorption spectrum by use of FT-IR of the compound on the solder particles surface-treated according to the present invention.

FIG. 1 shows the IR absorption spectrum of adipic acid itself by use of FT-IR. FIG. 2 shows the IR absorption spectrum by use of FT-IR of the adipic acid compound formed according to the present invention (a vapor-phase method) on the solder particles. As is apparent from FIGS. 1 and 2, the adipic acid compound formed on the surface of the solder particles is a substance clearly different from adipic acid itself. It is hypothesized that the adipic acid compound formed on the surface of the solder particles is a chelate complex compound which is a product from the reaction between the adipic acid and a metal of the solder alloy and is a tough substance strongly adhering to the surface of the solder particles. Thus, in the solder powder obtained according to the present invention, the adipic acid combines chemically with a metal of the solder alloy to produce a layer of an adipic acid compound which is tough and covers the entire surface of the solder particle.

As stated above, since the present invention provides a protective layer which is an organometallic compound composed of adipic acid and a metal of the solder alloy on the surface of the solder particles, the oxidation of the solder powder during storage after the production of the powder is inhibited. Accordingly, the solder powder having the protective layer according to the present invention is hardly oxidized, and thus the solder particles having a particle diameter of less than 20 μm, which have been difficult to use, can be accepted for the formation of a finer circuit pattern. Further, the present invention makes it possible to protect the surface of the solder particles from oxidation during all steps, including formation of a paste from a solder powder, printing, transferring to a reflow oven and reflow soldering. As a result, the generation of solder balls is minimized when the solder paste made from this solder powder is used, and the advantages are that, since the amount of the active ingredients in the flux can be minimized and the use of an active ingredient such as amine becomes unnecessary, the cleaning step involving the use of a flon can be omitted and that the solder powder, the solder paste and the method for making them can be attained, which are extremely suitable to the micro-soldering mounting technique in electronic circuits and the like which are being miniaturized and made lighter. In the case where the solder powder having the protective layer on the solder particles in the present invention is made into a solder paste, the adipic acid can be used in a smaller amount and more efficiently than in the conventional art where the adipic acid is incorporated as an active ingredient into the flux. That is, if the adipic acid is blended into the flux, an excessive amount thereof needs to be added in order to obtain the same effect because not all the amount thereof reacts with the solder powder.

The present invention is explained in detail hereinafter.

EXAMPLE 1

Five g of adipic acid was placed in a 200 ml, three-neck separable flask mounted on a mantle heater. The three necks were each provided with a rubber stopper so that the central stopper held a thermometer, while the side stoppers each held a copper pipe and the flask was heated at 200° C. An argon gas stream was fed from one of the copper pipes at a rate of 10 ml/minute, while a tube which was connected to the other copper pipe serving as an outlet was introduced into a 100 ml sample bottle provided with a rubber stopper and the gas was led outside from the outlet of the bottle. The bottle contained 50 g of an Sn—Pb eutectic solder power (particle diameter: 20 to 40 μm) and the powder was maintained at 60° C. by immersing the bottom portion of the bottle in a water bath. The argon gas was passed for 1 hour and, when the adipic acid in the separable flask disappeared, the gas flow was stopped and the solder powder was taken out of the sample bottle. The solder powder was placed in a solution comprising 50 ml of ethanol and 1 to 2 drops (about 0.01 ml) from a syringe of guaranteed reagent-grade hydrochloric acid (concentration: 35 to 37%). The mixture was stirred for 3 hours and the organometallic compound on the surface of the solder particles was acid-extracted. The result of the analysis gave an equivalent weight of 0.05 g (0.1% by weight based on the total amount of the solder powder treated) calculated as adipic acid.

EXAMPLE 2

The procedure of Example 1 was repeated except that the amount of the adipic acid placed in the separable flask was 1 g. The analysis of the solder powder taken out of the sample bottle and calculation were made as in Example 1. The result indicated an equivalent weight of 0.01 g (0.02% by weight based on the total amount of the solder powder treated) calculated as adipic acid.

EXAMPLE 3

The procedure of Example 1 was repeated except that the amount of adipic acid placed in the separable flask was 3 g. The analysis of the solder powder taken out of the sample bottle and calculation were made as in Example 1. The result indicated an equivalent weight of 0.03 g (0.06% by weight based on the total amount of the solder powder treated) calculated as adipic acid.

EXAMPLE 4

The procedure of Example 1 was repeated except that the amount of adipic acid placed in the separable flask was 10 g. The analysis of the solder powder taken out of the sample bottle and calculation were made as in Example 1. The result indicated 0.1 g (0.2% by weight based on the total amount of the solder powder treated) calculated as adipic acid.

EXAMPLE 5

The procedure of Example 1 was repeated except that the amount of adipic acid placed in the separable flask was 20 g. The analysis of the solder powder taken out of the sample bottle and calculation were made as in Example 1. The result indication 0.2 g (0.4% by weight based on the total amount of the solder powder treated) of the organometallic compound calculated as adipic acid.

EXAMPLE 6

50 g of the same solder powder and 0.5 g of the same adipic acid as used in Example 1 were mixed well and placed in a rotary evaporator. While applying a vacuum to the rotary evaporator, the rotary evaporator was heated by an oil bath kept at 110° C. to generate the vapor of adipic acid and was rotated for 30 minutes. In this way, the vapor of the adipic acid was brought into contact and reacted with the surface of the solder particles. The solder powder was left to cool and was then taken out of the rotary evaporator. The analysis of the solder powder and calculation were made as in Example 1. The result indication an equivalent weight of 0.1 g (0.2% by weight based on the total amount of the solder powder treated) calculated as adipic acid.

Comparative Example 1

The same solder powder as that used in Example 1 was not subjected to the surface treatment.

Comparative Example 2

The procedure of Example 1 was repeated except that the amount of adipic acid placed in the separable flask was 0.2 g. The analysis of the solder powder taken out of the sample bottle and calculation were made as in Example 1. The result indication an equivalent weight of 0.002 g (0.004% by weight based on the total amount of the solder powder treated) calculated as adipic acid.

Comparative Example 3

The procedure of Example 1 was repeated except that the amount of adipic acid placed in the separable flask was 40 g. The analysis of the solder powder taken out of the sample bottle and calculation were made as in Example 1. The result indicated 0.4 g (0.8% by weight based on the total amount of the solder powder treated) of the organometallic compound calculated as adipic acid. The treated solder powder agglomerated, when dried, to produce a poor dispersion and, therefore, the treated powder could not be made into a paste.

Comparative Example 4

The procedure of Example 1 was repeated except that substance placed in the separable flask was stearic acid and the amount of stearic acid was 1.5 g. The amount of the stearic acid that adhered to the surface of the solder particles was 0.05 g (0.1% by weight based on the total amount of the solder powder treated).

Comparative Example 5

800 g of glass beads having a diameter of 6 mm was placed in a beads mill having a capacity of 1 liter. Further, 1 kg of the same solder powder and 3 g of the same adipic acid used in Example 1 were placed in the beads mill and the contents were mixed at a rotation of 20 rpm for 30 minutes. The substance on the surface of the solder particles was subjected to analysis by means of FT-IR. The IR absorption spectrum showed peaks identical to those in the IR absorption spectrum of FIG. 1, thus indicating that the adipic acid did not combine chemically with the metal of the solder alloy but merely adhered to the surface of the solder particles.

Then, 2.25 g of the treated solder powders obtained in Examples 1 to 6 and Comparative Examples 1 to 5, respectively, and 0.25 g of a flux (comprising 60% of rosin, 30% of butylcarbitol, 9% of hydrogenated castor oil and 1% of cyclohexylamine) were each placed in a 10 ml polyethylene container. The mixtures were kneaded with a spatula for 5 minutes to prepare respective pastes. The paste was printed on a 0.6 mm thick, alumina-ceramic substrate through a 0.15 mm thick stainless steel plate having a circular hole of a diameter of 6.5 mm. The printed substrate was placed on a hot plate kept at 210° C. so that the reflow of the solder powder would occur. If the solder powder melted to form a single ball, the phenomenon was judged as not generation solder balls. Meanwhile, if the solder powder melted to form separate parts like satellites, the phenomenon was judged as generating solder balls. The states were evaluated in 6 levels, namely, 0: no generation of solder balls; and 5: solder balls spread over the substrate without being united. The time span between the completion of printing and reflowing was divided into 4 groups, namely, 0, 1, 5 and 10 hours. The results are shown in Table 1.

TABLE 1

| | Amount calculated as adipic acid (% by weight) | Time span after printing | | | |
|---|---|---|---|---|---|
| | | Immediately after printing | After 1 hour | After 5 hours | After 10 hours |
| Ex. 1 | 0.1 | 0 | 0 | 1 | 1 |
| Ex. 2 | 0.02 | 0 | 1 | 2 | 3 |
| Ex. 3 | 0.06 | 0 | 1 | 1 | 2 |
| Ex. 4 | 0.2 | 0 | 0 | 1 | 1 |
| Ex. 5 | 0.4 | 0 | 0 | 0 | 1 |
| Ex. 6 | 0.2 | 0 | 0 | 0 | 1 |
| Comp. Ex. 1 | 0 | 1 | 3 | 5 | 5 |
| Comp. Ex. 2 | 0.004 | 1 | 2 | 4 | 5 |
| Comp. Ex. 3 | 0.8 | Impossible to evaluate | | | |
| Comp. Ex. 4 | 0.1 (Stearic acid) | 1 | 1 | 2 | 2 |
| Comp. Ex. 5 | 0.3 | 2 | 4 | 5 | 5 |

Ex.: Example
Comp. Ex.: Comparative Example

As is apparent from the results shown in Table 1, if the amount of the organometallic compound made from adipic acid is too small, the effect is low, whereas if the amount is too large, the impasting of the treated solder powder becomes difficult. At the same time, it also can be seen from Table 1 that the use of an organic acid (stearic acid in this case) other than that specified in the present invention or the coating layer made up of adipic acid without chemical bonding to the solder particles cannot inhibit the generation of the solder balls.

Further, in order to evaluate the stability of the treated solder powders to an environmental condition, the treated solder powders obtained in Examples 1 to 6 and Comparative Examples 1 to 5 were placed, respectively, in laboratory dishes, which were exposed to a condition of 50° C. and 90% RH for 24 hours. Generally, a conventional solder powder deteriorates due to accelerated oxidation under such conditions. For comparison with the exposed solder powders, the corresponding unexposed solder powders were also made into pastes and the evaluation tests were performed. The evaluation was conducted in the same manner as described above. The obtained results are shown in Table 2, which indicate that the solder powders according to the present invention exhibit a lower deterioration with time.

TABLE 2

| | Amount calculated as adipic acid (% by weight) | Unexposed | After accelerated oxidation of 24 hours |
|---|---|---|---|
| Ex. 1 | 0.1 | 0 | 1 |
| Ex. 2 | 0.02 | 0 | 1 |
| Ex. 3 | 0.06 | 0 | 1 |
| Ex. 4 | 0.2 | 0 | 1 |
| Ex. 5 | 0.4 | 0 | 1 |
| Ex. 6 | 0.2 | 0 | 1 |
| Comp. Ex. 1 | 0 | 1 | 5 |
| Comp. Ex. 2 | 0.004 | 1 | 5 |
| Comp. Ex. 3 | 0.8 | Impossible to evaluate | |
| Comp. Ex. 4 | 0.1 (Stearic acid) | 1 | 5 |
| Comp. Ex. 5 | 0.3 | 1 | 5 |

Ex.: Example
Comp. Ex.: Comparative Example

Figure 3:
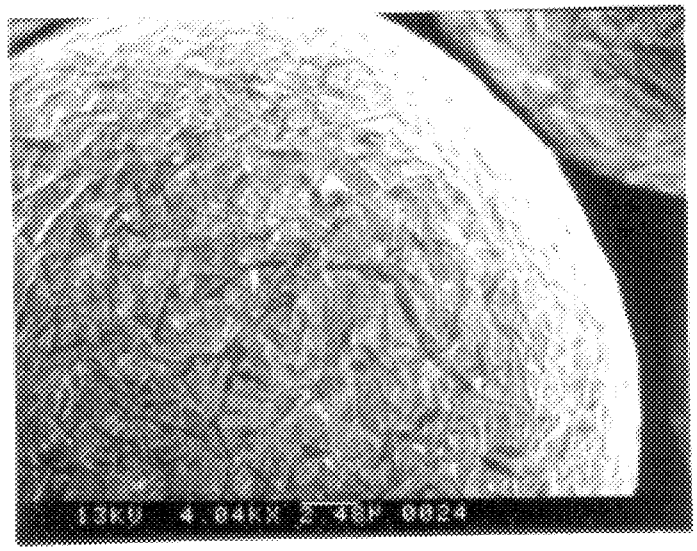
FIG. 3 shows an SEM (scanning electron microscope) photograph of the surface-treated solder particles obtained in Example 5.
Figure 4:
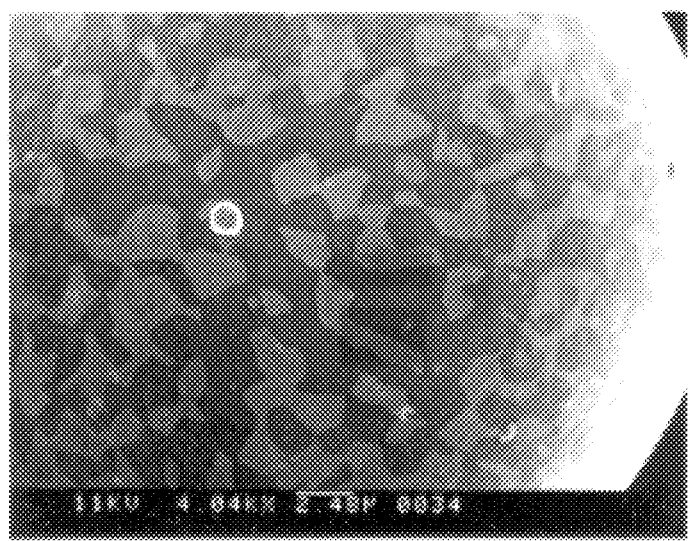
FIG. 4 shows an SEM photograph of the untreated solder particles having a eutectic structure.

FIG. 3 shows an SEM photograph of the surface-treated solder particles obtained in Example 6. FIG. 4 shows an SEM photograph of the untreated solder particles having a eutectic structure for comparison. FIGS. 3 and 4 show the photographs of the surface of the solder particles at a magnification of 4,000 times. As is apparent from FIG. 3, the particles of the solder powder, in which the adipic acid on the solder particles is combined chemically with a metal of the solder alloy to produce an organometallic compound according to the present invention, have the reaction product thus formed on the surface without destroying the eutectic structure and the reaction product covers the entire surface of the solder particles.

The pastes in the following test were prepared in order to compare the solder ball inhibiting effect between a sample which comprised a solder powder treated with adipic acid and a flux not incorporated with adipic acid, and a sample which comprised a solder powder not treated with adipic acid and a flux incorporated with adipic acid as an active ingredient.

Comparative Examples 6 to 10

Mixtures composed of 2.25 g of the same untreated solder powder as that used in Example 1 and 0.25 g of a flux (comprising 60% of rosin, 30% of butylcarbitol, 9% of hydrogenated castor oil and 1% of cyclohexylamine) were admixed, respectively, with 0.0013 g, 0.0025 g, 0.005 g, 0.025 g and 0.05 g of adipic acid, and the resultant mixtures were each placed in a 10 ml polyethylene container. The mixtures were kneaded with a spatula for 5 minutes to prepare the respective pastes.

On the other hand, by using the solder powders obtained in Examples 1 to 4 and Comparative Example 2, pastes were prepared according to the procedure described previously. These pastes and the pastes of Comparative Examples 6 to 10 were subjected to the aforementioned solder ball test (10 hours after the completion of printing). The results are shown in Table 3. As is apparent from Table 3, in order to obtain the same effect by the use of the paste, in which only the flux contains the adipic acid, an excessive amount of the adipic acid needs to be added to the flux, because not all the adipic acid added reacts with the solder powder.

EXAMPLE 7

The procedure of Example 1 was repeated except that a Sn—Pb eutectic solder powder (having a particle diameter of less than 40 μm and containing 10% of particles having a diameter of less than 20 μm) was used. The analysis of the solder powder taken out of the sample bottle and calculation were made as in Example 1. The results indicated an equivalent weight of 0.05 g (0.1% by weight based on the total amount of the solder powder treated) calculated as adipic acid.

Comparative Example 11

The same solder powder as that used in Example 7, i.e., a Sn—Pb eutectic solder powder (having a particle diameter of less than 40 μm and containing 10% of particles having a diameter of less than 20 μm) was not subjected to the surface treatment.

The solder powders obtained in Examples 1 and 7 and Comparative Example 11 were made, respectively, into pastes according to the procedure described previously. The pastes underwent the aforementioned solder ball test, a test for a printable pitch, a sag test after printing and a test for adhesive strength (in accordance with JIS Z 3284). The results are shown in Table 4. As is apparent from Table 4, the pastes according to the present invention exhibit a smaller printable pitch, a lower sag after printing and a larger value of adhesive strength, while inhibiting the generation of solder balls, even if the pastes used a solder powder containing fine particles having a diameter of less than 20 μm. Thus, the pastes according to the present invention are preferable for obtaining a finer circuit pattern.

TABLE 3

| | Solder powder treated with adipic acid | | | | Adipic acid added to the flux | | |
|---|---|---|---|---|---|---|---|
| No. | Amount of the substance calculated as adipic acid based on solder powder (% by weight) | Amount of the substance calculated as adipic acid based on solder paste (% by weight) | Evaluation of solder balls | No. | Amount of the substance calculated as adipic acid based on solder powder (% by weight) | Amount of the substance calculated as adipic acid based on solder paste (% by weight) | Evaluation of solder balls |
| Ex. 4 | 0.2 | 0.18 | 1 | CE. 6 | 0 | 1.8 | 2 |
| Ex. 1 | 0.1 | 0.09 | 1 | CE. 7 | 0 | 0.9 | 3 |
| Ex. 3 | 0.06 | 0.054 | 2 | CE. 8 | 0 | 0.18 | 4 |
| Ex. 2 | 0.02 | 0.018 | 3 | CE. 9 | 0 | 0.09 | 5 |
| CE. 2 | 0.004 | 0.003 | 5 | CE. 10 | 0 | 0.054 | 5 |

Ex.: Example
CE: Comparative Example

The pastes in the following test were prepared in order to compare the difference in effect between a sample paste which used solder powder containing particles having a diameter of less than 20 μm, and a sample paste which did not use solder powder containing particles having a diameter of less than 20 μm.

TABLE 4

|   | Conditions in preparation | | Evaluation results | | | |
|---|---|---|---|---|---|---|
|   | Solder powders used | Amount of the substance calculated as adipic acid based on solder powder | Evaluation of solder balls | Printable pitch | Sag after printing | Adhesive strength (gf) |
| Ex. 1 | Without particles of less than 20 μm | 0.1 wt % | 1 | 0.5 mm | Somewhat sagged | 100 |
| Ex. 7 | With particles of less than 20 μm | 0.1 wt % | 1 | 0.3 mm | None | 120 |
| CE. 11 | With particles of less than 20 μm | Untreated | 4 | 0.3 mm | None | 120 |

Ex.: Example
CE.: Comparative Example

Further, in order to examine the reliability, a comparison was made between the paste prepared from the solder powder obtained in Example 1 and the paste prepared from the solder powder described in Comparative Example 1, using a substrate having a comb-shaped pattern of a pitch spacing of 0.635 mm described in IPC-B-25. The testing procedure comprised pattern-printing the pastes on the substrate, reflow-soldering the pattern in a reflow apparatus to prepare printed-circuit boards, placing the printed-circuit boards in a thermostatted chamber maintained at 85° C. and 85% RH and applying a DC 48 V potential to the printed-circuit boards, and measuring the resistance of the pattern every 24 hours by DC 100 V. FIG. 5 shows the changes with time in 168 hours (one week) in the surface insulation resistance of printed-circuit boards. The results indicate that the surface treatment according to the present invention does not adversely affect the solder characteristics, because the paste, which is made from the solder powder treated according to the present invention, provides a surface insulation resistance of the order of $10^9 \Omega$ which is almost equivalent to that from untreated solder powder and which changes only slightly with time.

What is claimed is:

1. A solder powder consisting essentially of solder alloy particles having an organometallic compound layer formed on the outer surface thereof through the reaction of adipic acid with a metal in the solder alloy.

2. A solder powder according to claim 1, wherein the amount of the organometallic compound, after being acid-extracted and calculated as adipic acid, on the surface of the solder alloy particles ranges from 0.01 to 0.5% by weight based on the total amount of the solder powder.

3. A solder powder according to claim 2, wherein the amount of the organometallic compound, calculated as adipic acid, ranges from 0.01 to 0.3% by weight based on the total amount of the solder powder.

4. A solder powder according to claim 2, wherein the amount of the organometallic compound, calculated as adipic acid, ranges from 0.04 to 0.2% by weight based on the total amount of the solder powder.

5. A solder powder according to claim 1, wherein the solder is a Pb—Sn alloy.

6. A solder powder according to claim 1, wherein the solder alloy contains at least one element selected from the group consisting of indium, silver, bismuth, zinc, antimony and copper.

7. A solder paste comprising the solder powder according to claim 1.

8. A solder paste using the solder powder according to claim 3, wherein the solder powder contains fine particles having a particle diameter of less than 75 μm.

9. A solder paste using the solder powder according to claim 3, wherein the solder powder contains fine particles having a particle diameter of less than 45 μm.

10. A solder paste using the solder powder according to claim 3, wherein the solder powder contains fine particles having a particle diameter of less than 20 μm.

11. A method for making a solder alloy powder, comprising reacting particles of the solder alloy powder with vaporized adipic acid so that an organometallic compound which is composed of the adipic acid and a metal of the solder alloy is formed on the surface of the solder alloy particles.

* * * * *